(12) United States Patent
Kitamura

(10) Patent No.: US 11,923,174 B2
(45) Date of Patent: Mar. 5, 2024

(54) PLASMA PROCESSING SYSTEM AND METHOD OF SUPPORTING PLASMA IGNITION

(71) Applicant: TOKYO ELECTRON LIMITED, Tokyo (JP)

(72) Inventor: Yuji Kitamura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 436 days.

(21) Appl. No.: 17/006,557

(22) Filed: Aug. 28, 2020

(65) Prior Publication Data
US 2021/0066044 A1 Mar. 4, 2021

(30) Foreign Application Priority Data
Aug. 29, 2019 (JP) ................... 2019-156861

(51) Int. Cl.
*H01J 37/32* (2006.01)
*H01L 21/66* (2006.01)
*H01L 21/67* (2006.01)

(52) U.S. Cl.
CPC .... *H01J 37/32183* (2013.01); *H01J 37/3299* (2013.01); *H01L 21/67069* (2013.01); *H01L 21/67253* (2013.01); *H01L 22/20* (2013.01)

(58) Field of Classification Search
CPC ............ H01J 37/32183; H01J 37/3299; H01J 37/32091; H01J 2237/334; H01J 37/32935; H01J 2237/3341; H01L 21/67069; H01L 21/67253; H01L 22/20; H03H 7/40
See application file for complete search history.

(56) References Cited

U.S. PATENT DOCUMENTS

| 8,741,095 | B2 * | 6/2014 | Koshimizu | ....... | H01J 37/32165 |
| | | | | | 156/345.43 |
| 9,502,221 | B2 * | 11/2016 | Valcore, Jr. | .......... | G05B 19/418 |
| 2006/0021580 | A1 * | 2/2006 | Hirano | .............. | H01J 37/32082 |
| | | | | | 118/722 |

(Continued)

FOREIGN PATENT DOCUMENTS

| JP | 2003234340 A | * | 8/2003 | ........... | C23C 16/505 |
| JP | 2009206346 A | * | 9/2009 | ........ | H01J 37/32082 |

(Continued)

*Primary Examiner* — Mohammed Shamsuzzaman
(74) *Attorney, Agent, or Firm* — XSENSUS LLP

(57) ABSTRACT

A plasma processing system includes a plasma processing apparatus including a processing container that accommodates a substrate, and configured to perform a plasma processing on the substrate by generating a plasma in the processing container; and a control device configured to control the plasma processing apparatus. The control device collects a measurement value indicating a matching state of impedance between a power supply and the plasma; specifies a point corresponding to a value of the variables that maximizes a gradient of change of the measurement value with respect to a vector; specifies a point farther from the matching point than the passing point on a straight line; and ignites the plasma in the plasma processing apparatus by controlling each variable so that the measurement value changes from the starting point toward the matching point along the straight line.

13 Claims, 11 Drawing Sheets

(56) References Cited

U.S. PATENT DOCUMENTS

| | | | | |
|---|---|---|---|---|
| 2006/0220574 A1* | 10/2006 | Ogawa | ............. | H01J 37/32183 |
| | | | | 315/111.21 |
| 2018/0012736 A1* | 1/2018 | Yamada | ............ | H01J 37/32146 |
| 2020/0083022 A1* | 3/2020 | Huang | ............. | H01L 21/31116 |
| 2020/0343076 A1* | 10/2020 | Bhutta | ............. | H01L 21/28556 |

FOREIGN PATENT DOCUMENTS

| | | | | | |
|---|---|---|---|---|---|
| JP | 2010-153274 A | | 7/2010 | | |
| JP | 4606944 B2 | * | 1/2011 | ........ | H01J 37/32082 |
| JP | 2012060104 A | * | 3/2012 | ........ | H01J 37/32091 |
| JP | 2017139164 A | * | 8/2017 | ............. | H01J 37/32 |
| KR | 20110098653 A | * | 1/2011 | ........ | H01J 37/32082 |
| KR | 20190126387 A | * | 11/2019 | ............. | H01J 37/32 |
| TW | 200414831 A | * | 8/2004 | ............. | H01J 37/32 |
| TW | 202029271 A | * | 8/2020 | ........ | H01J 37/32091 |

\* cited by examiner

PLASMA PROCESSING SYSTEM AND METHOD OF SUPPORTING PLASMA IGNITION

CROSS-REFERENCE TO RELATED APPLICATIONS

This application is based on and claims priority from Japanese Patent Application No. 2019-156861 filed on Aug. 29, 2019 with the Japan Patent Office, the disclosure of which is incorporated herein in its entirety by reference.

TECHNICAL FIELD

The present disclosure relates to a plasma processing system and a method of supporting plasma ignition.

BACKGROUND

In a manufacturing process of a semiconductor in recent years, a plasma processing apparatus that processes a substrate using a plasma is used. In the plasma processing apparatus, a processing gas is supplied into a processing container, and the inside of the processing container is adjusted to a predetermined pressure. Then, a radio-frequency power is supplied into the processing container to convert the processing gas into a plasma, and a plasma processing such as etching is performed on the substrate accommodated in the processing container by the plasma. See, for example, Japanese Patent Laid-Open Publication No. 2010-153274.

SUMMARY

A plasma processing system according to an aspect of the present disclosure includes a plasma processing apparatus and a control device. The plasma processing apparatus includes a processing container accommodating a substrate, and performs a plasma processing on the substrate by generating a plasma in the processing container. The control device controls the plasma processing apparatus. Further, the control device executes a collecting processing, a first specifying processing, a second specifying processing, and an igniting processing. In the collecting processing, a measurement value indicating a matching state of impedance between a power supply and the plasma, with respect to each value of adjustable variables related to the matching of the impedance between the power supply that supplies a radio-frequency power to the plasma and the plasma is collected. In the first specifying processing, a point corresponding to a value of the variables that maximizes a gradient of change of the measurement value with respect to a vector extending from a point corresponding to each variable to a matching point that is a point corresponding to a measurement value in a state where the impedance is most matched is specified as a passing point, In the second specifying processing, on a straight line including the passing point and the matching point, a point farther from the matching point than the passing point is specified as a starting point. In the igniting processing, the plasma is ignited in the plasma processing apparatus by controlling each variable so that the measurement value changes from the starting point toward the matching point along the straight line.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of a plasma processing system and a method of plasma ignition support disclosed herein will be described in detail with reference to the drawings. The disclosed plasma processing system and the method of plasma ignition support are not limited to the embodiments below.

By the way, a matching circuit is provided between a power supply and a processing space in which a plasma is generated so that a radio-frequency power from the power supply is efficiently supplied to the plasma in the processing space. The matching circuit operates so as to match output impedance of the power supply and impedance of the plasma in the processing space. In the following, the generation of plasma in the processing space is referred to as ignition of plasma.

The impedance of the plasma changes during the procedure of the ignition of the plasma. As a result, when the matching circuit is operated during the procedure of the ignition of the plasma, the matching operation is proceeded in a state where the plasma is not ignited yet, and the matching circuit may be stable in the state where the plasma is not ignited. Further, when the matching circuit is operated during the procedure of the ignition of the plasma, even when the plasma is ignited once, the plasma may be extinguished again due to the matching operation. As described above, when the ignition of the plasma and the matching operation are performed in parallel, it is difficult to stably ignite the plasma.

Therefore, the present disclosure is to provide a technology capable of stably igniting a plasma.

[Configuration of Plasma Processing System 1]

Figure 1:
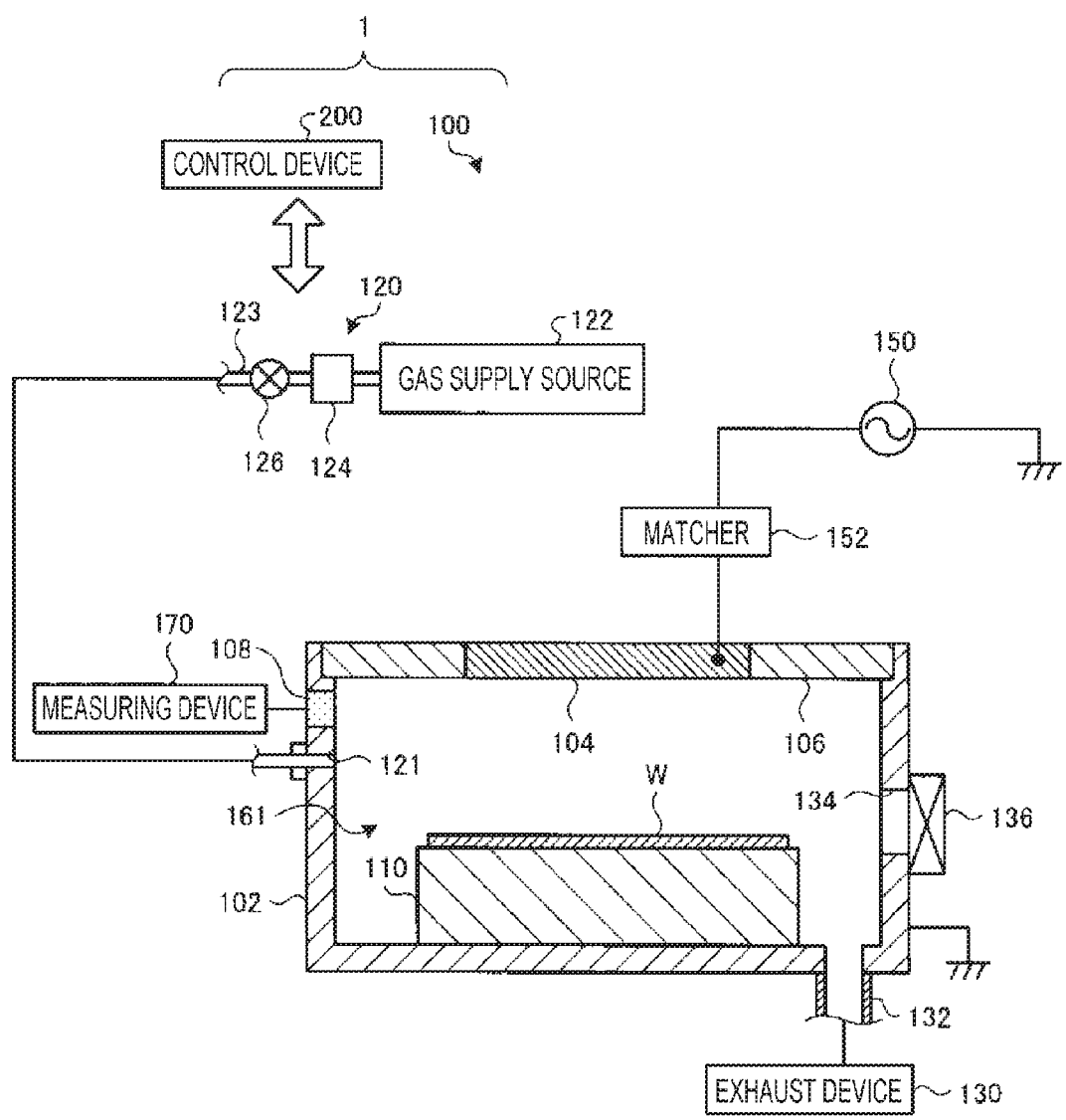
FIG. 1 is a view illustrating an example of a plasma processing system according to an embodiment of the present disclosure.

FIG. 1 is a view illustrating an example of a plasma processing system 1 according to an embodiment of the present disclosure. The plasma processing system 1 includes a plasma processing apparatus 100 and a control device 200. The plasma processing apparatus 100 excites a processing gas that stays between electrodes by the radio-frequency power supplied to at least one of the two facing electrodes. Therefore, the plasma processing apparatus 100 generates a plasma in the processing container chamber, and performs a plasma processing such as etching on a semiconductor wafer W by the generated plasma. In the embodiment, the plasma processing apparatus 100 is a plasma processing apparatus using a capacitively coupled plasma (CCP).

The plasma processing apparatus 100 has a processing container 102 formed in a tubular shape (e.g., cylindrical shape) from a metal such as aluminum, and accommodating a semiconductor wafer W that is an example of a substrate. The processing container 102 is grounded. The shape of the processing container 102 is not limited to a cylindrical shape, and may be, for example, a rectangular tube shape (e.g., a box shape).

A stage 110 is provided in the processing container 102 to mount the wafer W thereon. The stage 110 is formed of, for example, aluminum in a substantially pillar shape (e.g., a columnar shape). The shape of the stage 110 is not limited to a columnar shape, and may be, for example, a rectangular tube shape (e.g., a polygonal pillar shape). Further, although not illustrated, the stage 110 is provided with an electrostatic chuck that adsorbs and holds the semiconductor wafer W by an electrostatic force or a temperature adjusting mechanism that adjust the temperature of the semiconductor wafer W.

On the upper portion of the processing container 102, an upper electrode 104 formed of a conductive material such as silicon in a plate shape is provided via an insulating member 106. The insulating member 106 is formed, for example, in a ring shape with ceramic, and may be provided on the outer periphery of the upper electrode 104. The upper electrode 104 is provided above the stage 110 to face the stage 110. The space surrounded by the processing container 102 and the upper electrode 104 is defined as a processing chamber 161.

A gas introduction port 121 is formed in the side wall of the processing container 102, and a gas supply mechanism 120 is connected to the gas introduction port 121 via a pipe 123. The gas supply mechanism 120 includes a gas supply source 122, a flow rate controller 124, and a valve 126. The gas supply source 122 is a supply source for the processing gas such as $CF_4$ gas. The flow rate controller 124 controls the flow rate of the processing supplied from the gas supply source 122 into the processing chamber 161. The valve 126 controls the supply and stop of the supply of the processing gas from the gas supply source 122 into the processing chamber 161.

In FIG. 1, for simplicity of description, the gas supply mechanism 120 is illustrated as supplying a single type of processing gas into the processing container 102. However, the gas supply mechanism 120 is not limited to a case of supplying a single type of processing gas, and may supply a plurality of types of processing gases. Further, in FIG. 1, the processing gas supplied from the gas supply mechanism 120 is supplied from the gas introduction port 121 provided in the side wall of the gas supply mechanism 120 into the processing chamber 161. However, as another example, the processing gas may be supplied from substantially the center of the upper electrode 104 into the processing chamber 161. Further, the upper electrode 104 may have a shower head configuration.

An exhaust pipe 132 is connected to the bottom portion of the processing container 102 and an exhaust device 130 including, for example, a vacuum pump is connected to the exhaust pipe 132. The gas in the processing chamber 161 may be discharged by the exhaust device 130, and the pressure in the processing chamber 161 may be controlled to a desired pressure.

An opening 134 is formed in the side wall of the processing container 102 and the opening 134 is opened/closed by a gate valve 136. When the semiconductor wafer W is carried in, the gate valve 136 is opened and the semiconductor wafer W is carried into the processing chamber 161 by a transfer mechanism such as a transfer arm (not illustrated), and mounted on the stage 110. Then, after the transfer mechanism exits from the processing chamber 161, the gate valve 136 is closed, and a processing is performed on the semiconductor wafer W.

Further, a window 108 made of, for example, quartz is provided in the side wall of the processing container 102. A measuring device 170 that measures a light emission intensity of the plasma generated in the processing chamber 161 is connected to the window 108. Information on the light emission intensity of the plasma measured by the measuring device 170 is output to the control device 200. The information on the light emission intensity of the plasma measured by the measuring device 170 is an example of a measurement value indicating a matching state of impedance between the power supply and the plasma.

A radio-frequency power source 150 is connected to the upper electrode 104 via a matcher 152. The radio-frequency power source 150 is an example of a power supply. The radio-frequency power source 150 supplies a radio-frequency power of a predetermined frequency (e.g., 60 MHz) to the upper electrode 104. The magnitude of the radio-frequency power output from the radio-frequency power source 150 is controlled by the control device 200. The frequency of the radio-frequency power supplied to the upper electrode 104 is not limited to 60 MHz, and may be, for example, 13.56 MHz, 27 MHz, or 100 MHz. The radio-frequency power source 150 may be connected to the stage 110 via the matcher 152. In this case, the stage 110 is used as a lower electrode.

Figure 2:
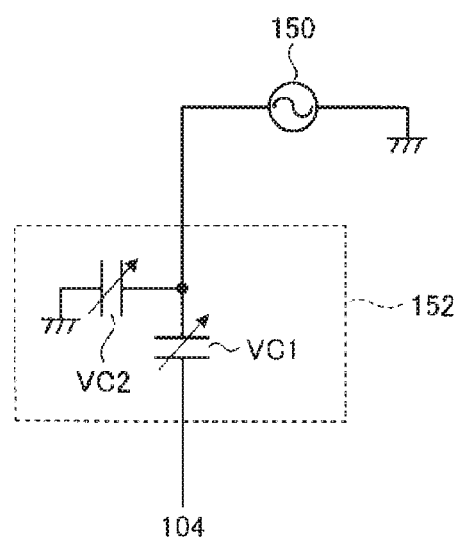
FIG. 2 is a view illustrating an example of a configuration of a matcher.

FIG. 2 is a view illustrating an example of a configuration of a matcher 152. The matcher 152 includes a variable capacitor VC1 and a VC2 whose capacities may be controlled. The VC1 is connected in series between the radio-frequency power source 150 and the upper electrode 104, and the VC2 is connected in parallel with the radio-frequency power source 150 between the radio-frequency power source 150 and ground potential (GND potential). The VC1 and the VC2 operate so that the output impedance of the radio-frequency power source 150 and the impedance of the plasma in the processing chamber 161 are matched. The capacities of the VC1 and the VC2 are controlled by the control device 200. Further, the matcher 152 outputs information indicating the magnitude of the power of a reflected wave with respect to the radio-frequency power supplied from the radio-frequency power source 150 to the upper electrode 104 to the control device 200.

A potential difference occurs between the upper electrode 104 and the stage 110 by the radio-frequency power supplied to the upper electrode 104. Then, the electrons existing in the processing chamber 161 are accelerated due to the generated potential difference, and collide with the processing gas supplied into the processing chamber 161, and thus, the processing gas supplied into the processing chamber 161 is excited, and the processing gas in the processing chamber 161 is formed into a plasma. Then, a predetermined processing such as etching is performed on the semiconductor wafer W on the stage 110 by ions or active species contained in the plasma.

The control device 200 includes, for example, a memory, a processor, and an input/output interface. The memory stores, for example, data such as a recipe or a program. The processor reads and executes the program stored in the memory. Then, the processor controls each part of the plasma processing apparatus 100 via the input/output interface, based on the data such as the recipe stored in the memory.

[Relationship between Control Variable and Plasma]

Figure 3:
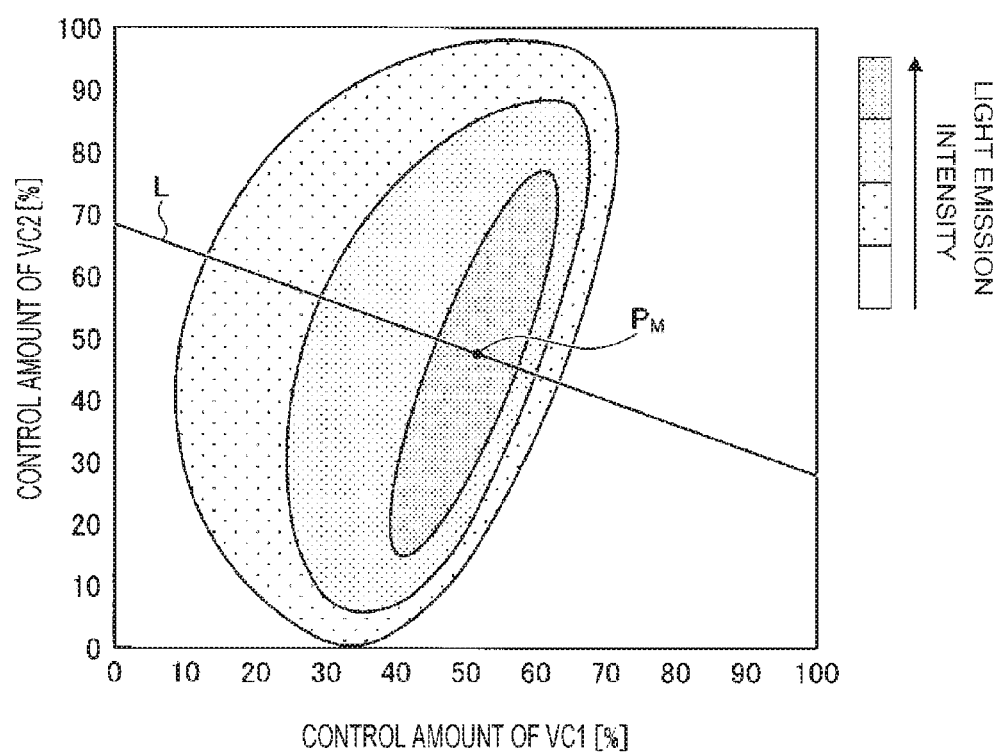
FIG. 3 is a view illustrating an example of relationship between control variables and a light emission intensity of a plasma.

FIG. 3 is a view illustrating an example of relationship between control variables and the light emission intensity of a plasma. In the example in FIG. 3, a control amount of the VC1 and a control amount of the VC2 included in the matcher 152 are used as examples of the control variable. The control amounts of the VC1 and the VC2 are amounts corresponding to the area where the electrode of the stator and the electrode of the rotor are overlapped with each other, and are control amounts in a case where the control amount in the state where the capacitance value of the electrode plate is the lowest is 0%, and the control amount in the state where the capacitance value is highest is 100%. The control variable is an example of adjustable variable related to the matching of the impedance between the radio-frequency power source 150 and the plasma.

For example, as illustrated in FIG. 3, the light emission intensity of the plasma differs depending on the combination of the control amount of the VC1 and the control amount of the VC2. In FIG. 3, as the light emission intensity of the plasma increases, the radio-frequency power from the radio-frequency power source 150 is efficiently supplied to the plasma, and the matching of the impedance between the radio-frequency power source 150 and the plasma is achieved. Among the above, a maximum point $P_M$ is a point corresponding to the light emission intensity of the plasma in the state where the impedance between the radio-frequency power source 150 and the plasma is most matched. The maximum point $P_M$ is an example of a matching point.

Figure 4:
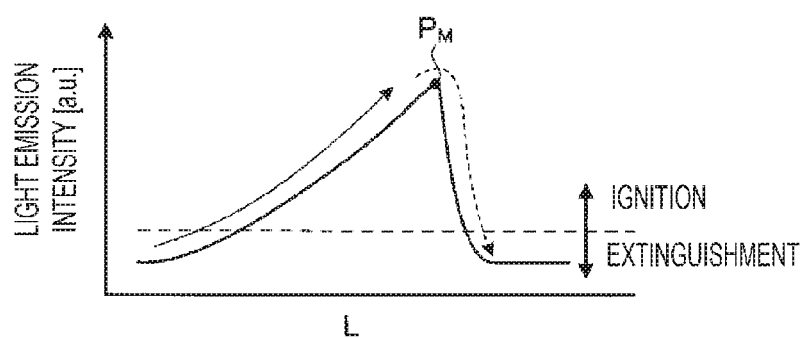
FIG. 4 is a view illustrating an example of a variable adjusting method.
Figure 5:
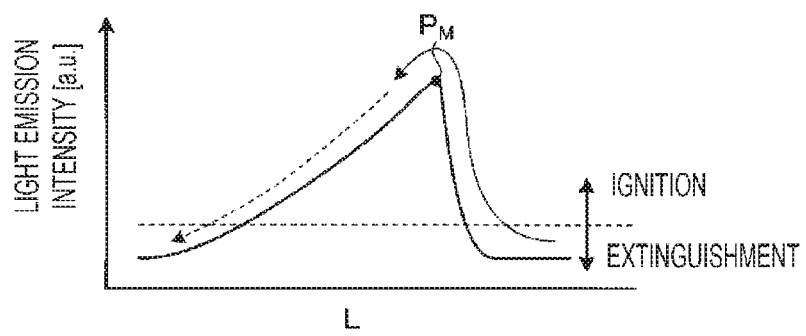
FIG. 5 is a view illustrating an example of a variable adjusting method.

For example, the distribution of the light emission intensity of the plasma in a direction along a straight line L passing through the maximum point $P_M$ in FIG. 3 is illustrated, for example, as in FIGS. 4 and 5. FIGS. 4 and 5 are views illustrating examples of a variable adjusting method. For example, as illustrated in FIG. 4, the change amount of the light emission intensity of the plasma (i.e., a gradient of the change of the light emission intensity) with respect to the change amount of the control variable in the direction along the straight line L differs depending on the value of the control variable.

Here, when the control variable is controlled along the straight line L from the direction in which the gradient of the change of the light emission intensity is gentle toward the maximum point $P_M$ at which the light emission intensity is the largest, the light emission intensity of the plasma changes, for example, as illustrated by the solid line arrow in FIG. 4. In this case, even when the plasma is ignited during the procedure of controlling the control variable along the straight line L toward the maximum point $P_M$, for example, due to control overshoot, the light emission intensity may be rapidly decreased as illustrated by the broken line arrow in FIG. 4. Therefore, the ignited plasma may be extinguished.

Meanwhile, as illustrated in FIG. 5, when the control variable is controlled along the straight line L from the direction in which the gradient of the change of the light emission intensity is steep toward the maximum point $P_M$, the light emission intensity of the plasma changes, for example, as illustrated by the solid line arrow in FIG. 5. In this case, the plasma is ignited during the procedure of controlling the control variable along the straight line L toward the maximum point $P_M$, for example, due to control overshoot, the light emission intensity is decreased as illustrated by the broken line arrow in FIG. 5. However, after passing through the maximum point $P_M$, the light emission intensity is gently decreased. As a result, it is possible to finely adjust the control variable before the plasma is extinguished, and the light emission intensity of the plasma may be brought close to the maximum point $P_M$ again. Therefore, the plasma may be stably ignited.

Therefore, in the relationship between the control variable and the light emission intensity of the plasma, it is desirable to specify the control direction of the control variable in which the gradient of the change of the light emission intensity is steep, and to control the control variable toward the maximum point $P_M$ at which the light emission intensity is the largest along the specified control direction.

[Control Direction Determining Method]

Figure 6:
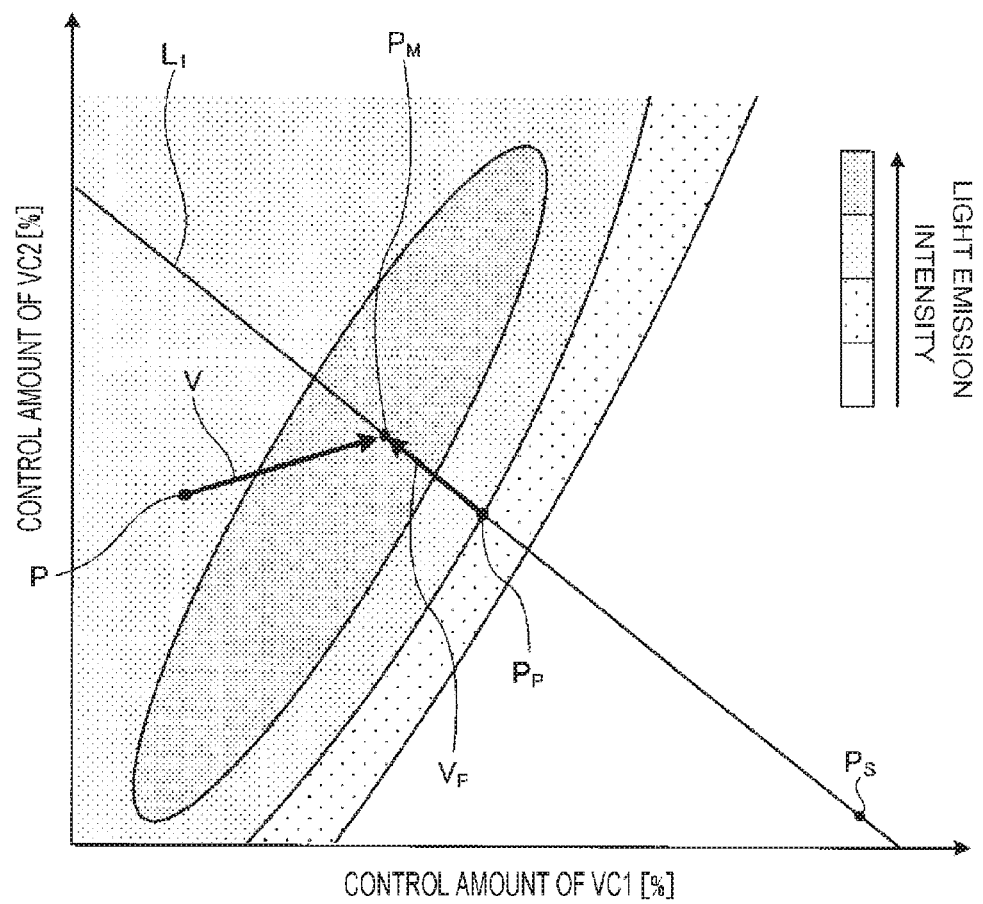
FIG. 6 is a view for explaining an example of a control direction determining method.

In order to determine the control direction of the control variables, at first, in the state where the plasma is ignited, the light emission intensity of the plasma at the value of each of the control variables is measured while changing the control variables. Then, for example, as illustrated in FIG. 6, the collected measurement values of the light emission intensity are plotted on the coordinates with the respective control variables as axes. FIG. 6 is a view for explaining an example of a control direction determining method. In the example in FIG. 6, the control amount of the VC1 and the control amount of the VC2 included in the matcher 152 are used as examples of the control variable.

Next, among the measurement values of the light emission intensity plotted on the coordinates, a point corresponding to a combination of the control variables that maximizes the measurement value of the light emission intensity is specified as the maximum point $P_M$.

Next, a measurement point P at which the gradient of the change of the measurement value of the light emission intensity is maximized with respect to a vector V having a point (measurement point P) corresponding to the combination of each of the control variables as a starting point and the maximum point $P_M$ as an end point is specified as a passing point $P_P$. The passing point $P_P$ is a point at which the gradient of the change of the light emission intensity is the steepest in the direction toward the maximum point $P_M$.

Next, a vector $V_P$ having the passing point $P_P$ as a starting point and the maximum point $P_M$ as an end point is specified. The direction of the vector $V_P$ is the control direction of the control variables.

The gradient of the change of the measurement value of the light emission intensity at the measurement point P is calculated as a ratio of the difference between the light emission intensity at the maximum point $P_M$ and the light emission intensity at the measurement point P and the magnitude of the vector V. The gradient of the change of the measurement value of the light emission intensity at the measurement point P may be calculated as a directional differential value in the direction indicated by the vector V, when the measurement value of the light emission intensity is regarded as a function of the control variables. Further, the specified passing point $P_P$ needs to have a monotonically increasing measurement value of the light emission intensity on the vector $V_p$ from the passing point $P_P$ to the maximum point $P_M$ in the direction indicated by the vector $V_P$. As a result, when the measurement value of the light emission intensity is decreased in at least a part of the vector $V_P$ from the passing point $P_P$ to the maximum point $P_M$ in the direction indicated by the vector $V_P$, it is not specified as the passing point $P_P$.

Next, a straight line $L_1$ including the specified vector V is specified. Then, on the straight line $L_1$, a point farther from the maximum point $P_M$ than the passing point $P_P$, and corresponding to the combination of the control variables in the area where the plasma is not ignited is specified a starting point $P_S$ of the control. The starting point $P_S$ may be such that the measurement value of the light emission intensity does not change or is monotonically increased on the straight line $L_1$ from the starting point $P_S$ to the passing point $P_P$.

[Ignition Control]

Figure 7:
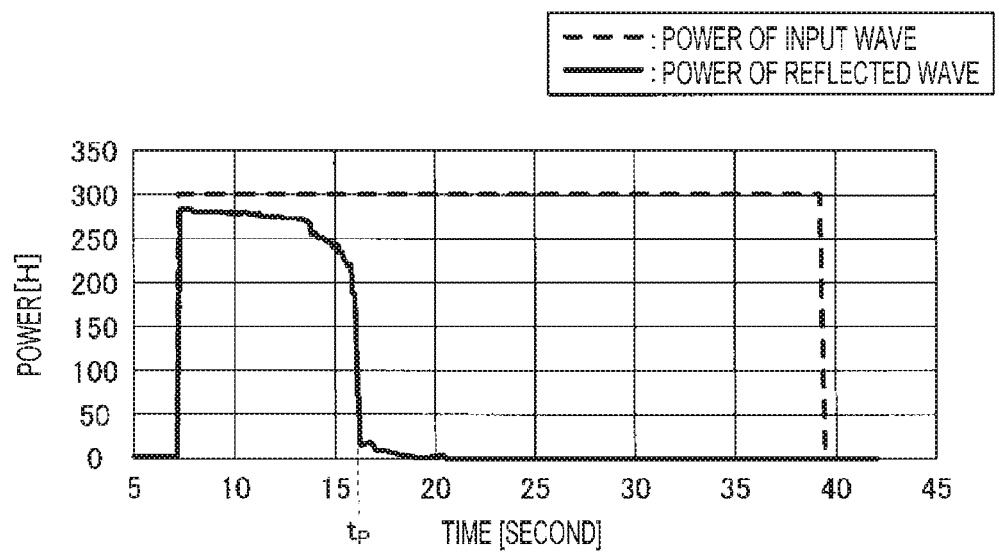
FIG. 7 is a view illustrating an example of change of a power of a reflected wave.

In the actual process using a plasma, each of the control variables is controlled so that the light emission intensity of the plasma changes from the starting point $P_S$ toward the maximum point $P_M$ along the straight line $L_1$. At this time, for example, as illustrated in FIG. 7, the magnitude of the power of the reflected wave with respect to the radio-frequency power supplied from the radio-frequency power source 150 to the upper electrode 104 is measured. FIG. 7 is a view illustrating an example of the change of the power of the reflected wave.

Figure 8:
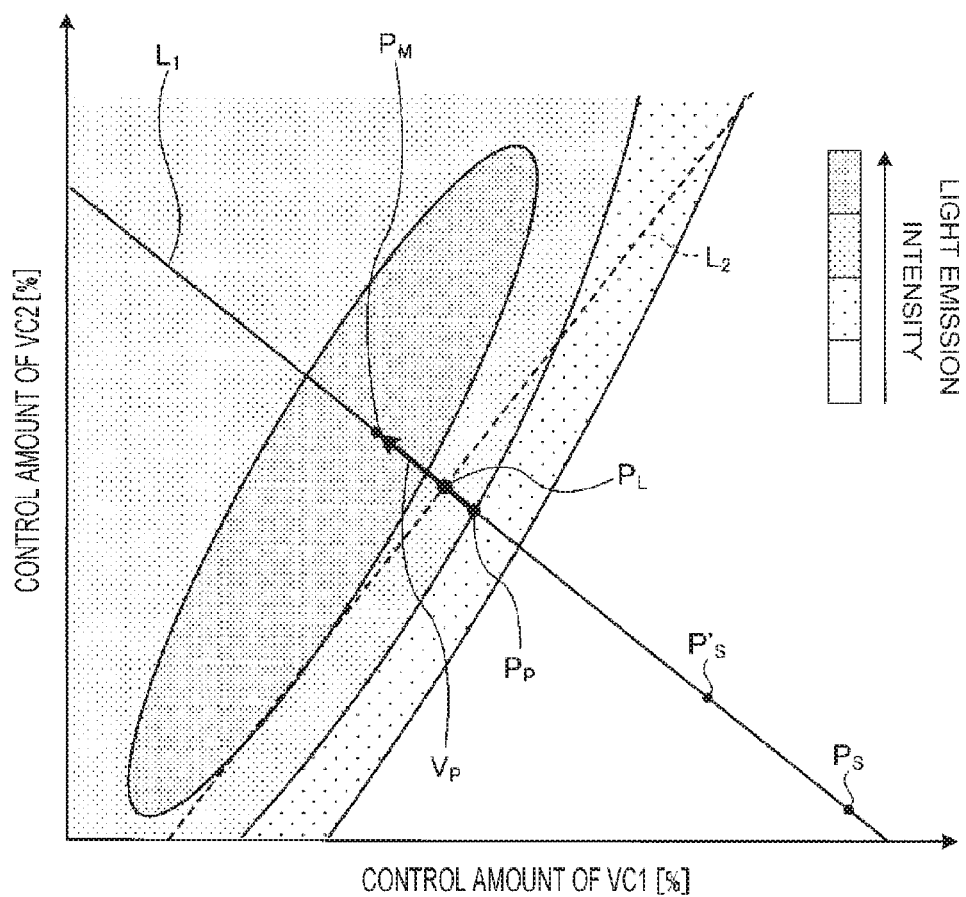
FIG. 8 is a view for explaining an example of a limit point and a limit line.

Next, a point corresponding to the combination of the control variables at a timing tp at which the gradient of the decreasing of the power of the reflected wave is maximized is specified as a limit point $P_L$. Then, after the plasma is actually ignited, for example, as illustrated in FIG. 8, on the coordinates with the respective control variables as the axes, a straight line passing through the limit point $P_L$ and orthogonal to the straight line $L_1$ is specified as a limit line $L_2$. FIG. 8 is a view for explaining an example of the limit point $P_L$ and the limit line $L_2$. Then, the plasma is adjusted using the value of the control variables on the maximum point $P_M$ side of the limit line $L_2$. Therefore, in the adjustment of the control variables after the ignition, the value of the control variables on the starting point $P_S$ side of the limit line $L_2$ is not used, and thus, the extinguishment of the plasma may be suppressed.

Figure 9:
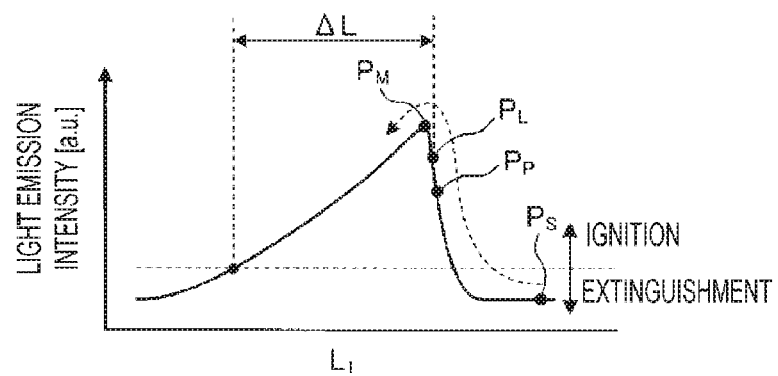
FIG. 9 is a view for explaining an example of control of a control variable when a process is executed.

Therefore, in the actual process using a plasma, each of the control variables is controlled so that the light emission intensity of the plasma changes, for example, as illustrated in FIG. 9. FIG. 9 is a view for explaining an example of the control of the control variables when the process is executed.

First, each of the control variables is controlled so that the light emission intensity of the plasma changes from the starting point $P_S$ toward the maximum point $P_M$ along the straight line $L_1$. Then, the limit point $P_L$ is specified based on the change of the power of the reflected wave, and the ignition of the plasma is detected. After the plasma is ignited, the plasma is adjusted using the value of the control variables (the value of the control variables included in a range $\Delta L$) on the maximum point $P_M$ side of the limit point $P_L$. In the range $\Delta L$, since the change of the light emission intensity of the plasma is gentle, the plasma is less likely extinguished even if some control overshoot occurs. As a result, in the adjustment of the control variables after the ignition, the extinguishment of the plasma may be suppressed.

Further, on the straight line $L_1$ illustrated in FIG. 8, a point $P_S'$ closer to the limit point $P_L$ than the starting point $P_S$ is updated as a new starting point $P_S$. Therefore, when the plasma is ignited in the next time, the time required for the ignition of the plasma from the start of the control may be shortened.

[Data Collecting Processing]

Figure 10:
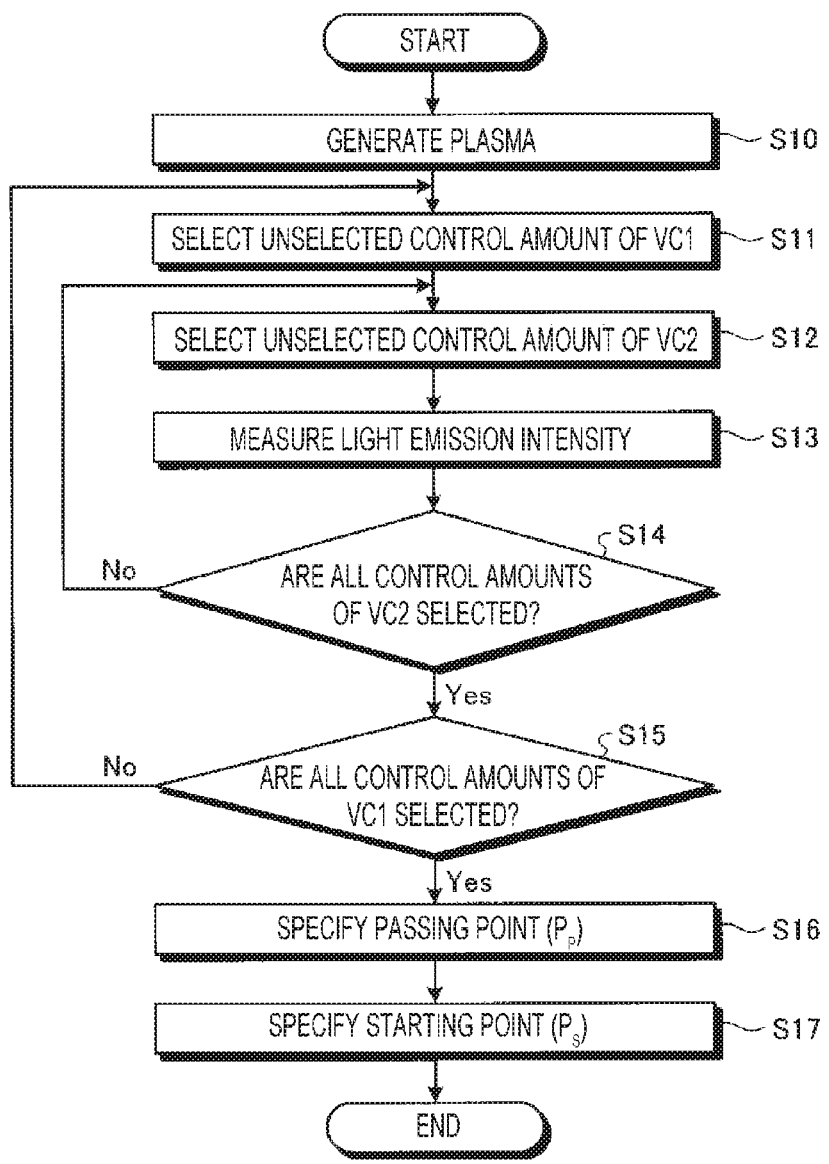
FIG. 10 is a flowchart illustrating an example of a data collecting processing.

FIG. 10 is a flowchart illustrating an example of a data collecting processing. In the data collecting processing illustrated in FIG. 10, the light emission intensity of the plasma is measured for each combination of the control variables, and the maximum point $P_M$, the passing point $P_P$, and the starting point $P_S$ are specified from the distribution of the measured light emission intensity of the plasma. The data collecting processing illustrated in FIG. 10 is implemented by controlling each part of the plasma processing apparatus 100 with the control device 200.

First, a plasma is generated in the processing chamber 161 with a predetermined control amount of the VC1 and a control amount of the VC2 (S10).

Subsequently, the control device 200 selects one value of unselected control amount among the values of the predetermined control amount of the VC1 (S11). In step S11, the control device 200 sequentially selects the value of the control amount of the VC1, for example, in steps of 1%, among the values of the control amount of the VC1 of 0% to 100%.

Subsequently, the control device 200 selects one value of unselected control amount among the values of the predetermined control amount of the VC2 (S12). In step S12, the control device 200 sequentially selects the value of the control amount of the VC2, for example, in steps of 1%, among the values of the control amount of the VC2 of 0% to 100%.

Subsequently, the measuring device 170 measures the light emission intensity of the plasma in the processing chamber 161 (S13). The control device 200 stores information on the light emission intensity of the plasma measured by the measuring device 170 in the memory corresponding to the control amount selected in step S11 and the control amount selected in step S12.

Subsequently, the control device 200 determines whether all the values of the control amount are selected among the values of the predetermined control amount of the VC2 (S14). When there is a value of the unselected control amount (No in step S14), the control device 200 executes again the processing described in step S12.

Meanwhile, when all the values of the control amount are selected (Yes in step S14), the control device 200 determines whether all the values of the control amount are selected among the values of the predetermined control amount of the VC1 (S15). When there is a value of the unselected control amount (No in step S15), the control device 200 executes again the processing described in step S11. The processing from step S10 to step S15 is an example of the collecting processing.

Meanwhile, when all the values of the control amount are selected (Yes in step S15), the control device 200 specifies the passing point $P_P$ using the collected data (S16). For example, in the relationship between the control variables (the control amount of the VC1 and the control amount of the VC2) and the light emission intensity of the plasma, the control device 200 calculates the gradient of the change of the measurement value of the light emission intensity with respect to the vector V having a point corresponding to each of the control variables as a starting point and the maximum point $P_M$ as an end point. Then, the control device 200 specifies a point corresponding to the combination of the control variables that maximizes the calculated gradient of the change of the measurement value of the light emission intensity with respect to the vector V as the passing point $P_P$. Step S16 is an example of a first specifying processing.

Subsequently, the control device 200 specifies the starting point $P_S$ using the specified passing point $P_P$ (S17). For example, on the straight line $L_1$ including the vector $V_P$ extending from the passing point $P_P$ to the maximum point $P_M$, the control device 200 specifies a point farther from the maximum point $P_M$ than the passing point $P_P$ as the starting point $P_S$ of the control. Step S17 is an example of a second specifying processing. Then, the data collecting processing illustrated in the flowchart is ended.

[Ignition Support Processing]

Figure 11:
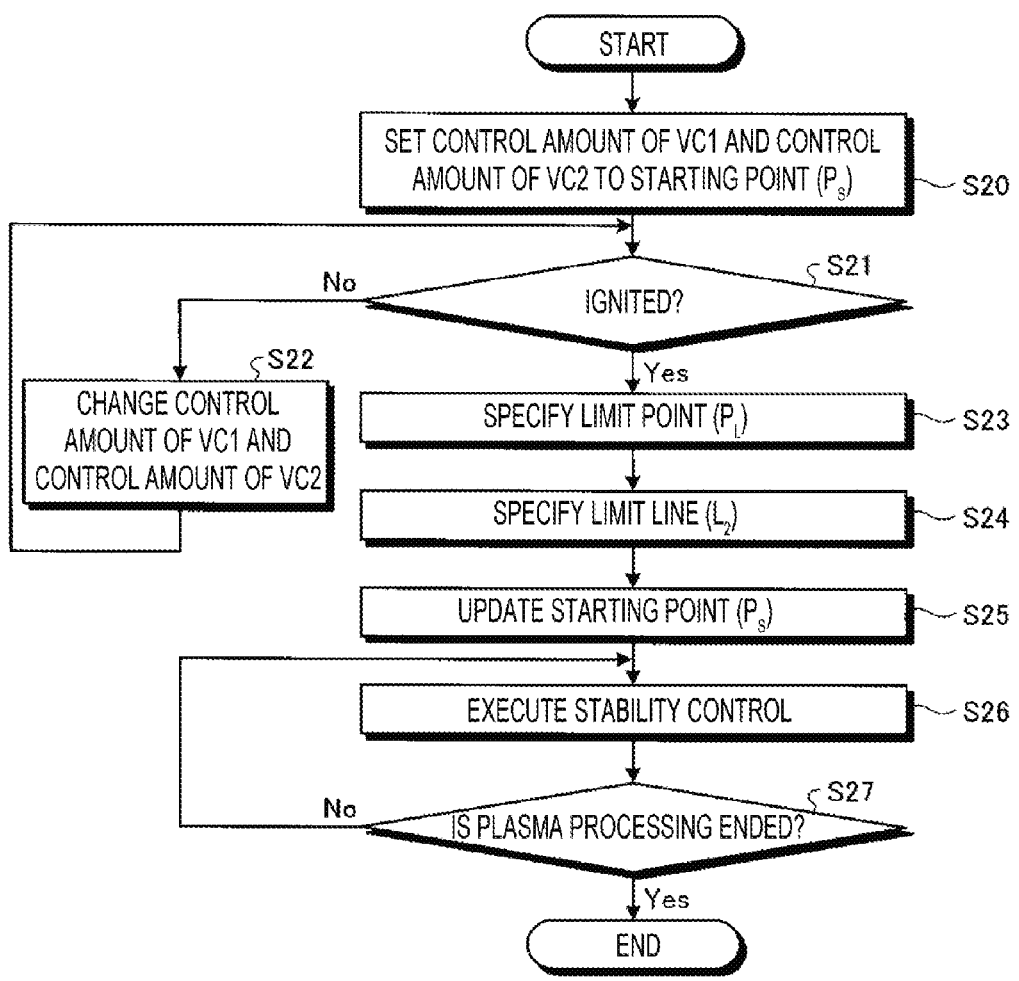
FIG. 11 is a flowchart illustrating an example of an ignition support processing.

FIG. 11 is a flowchart illustrating an example of an ignition support processing. The ignition support processing illustrated in FIG. 11 is implemented by controlling each part of the plasma processing apparatus 100 with the control device 200. Before the ignition support processing illustrated in FIG. 11 is started, the semiconductor wafer W is mounted on the stage 110, the processing gas is supplied into the processing chamber 161, and the inside of the processing chamber 161 is adjusted to a predetermined pressure.

First, the control device 200 controls the radio-frequency power source 150 and the matcher 152 to set the control amount of the VC1 and the control amount of the VC2 to the value corresponding to the starting point $P_S$ (S20). Then, the control device 200 determines whether the plasma is ignited in the processing chamber 161 (S21). In the embodiment, the control device 200 determines that the plasma is ignited in the processing chamber 161 when the magnitude of the power of the reflected wave output from the matcher 152 is decreased below a predetermined threshold value. Step S21 is an example of a measuring processing.

The control device 200 may determine that the plasma is ignited in the processing chamber 161 when the light emission intensity output from the measuring device 170 is increased above a predetermined threshold value. Further, the control device 200 may determine that the plasma is ignited in the processing chamber 161 when the magnitude of the power of the reflected wave output from the matcher 152 is decreased below a predetermined threshold value, and the light emission intensity output from, the measuring device 170 is increased above a predetermined threshold value.

When the plasma is not ignited in the processing chamber 161 (No in step S21), for example, as described in FIG. 8, the control device 200 changes the control amount of the VC1 and the control amount of the VC2 by a predetermined amount so that the light emission intensity of the plasma changes toward the maximum point $P_M$ along the straight line $L_1$ (S22). Then, the processing described in step S21 is executed again. Step S22 is an example of an igniting processing.

Meanwhile, when the plasma is ignited in the processing chamber 161 (Yes in step S21), the control device 200 specifies the limit point $P_L$, based on the history of the magnitude of the power of the reflected wave output from the matcher 152 (S23). For example, as described in FIGS. 7 and 8, the control device 200 specifies a point corresponding to the combination of the control amount of the VC1 and the control amount of the VC2 that maximizes the gradient of decreasing of the power of the reflected wave as the limit point $P_L$. Step S23 is an example of a third specifying processing.

Then, as described in FIG. 8, the control device 200 specifies a straight line passing through the limit point $P_L$ and orthogonal to the straight line $L_1$ as the limit line $L_2$ (S24). Then, the control device 200 updates the point $P_S'$ closer to the limit point $P_L$ than the starting point $P_S$ as a new starting point $P_S$ (S25). Step S25 is an example of an updating processing.

Subsequently, the control device 200 executes a stability control of the plasma (S26). In step S26, the control amount of the VC1 and the control amount of the VC2 are adjusted so that the impedance between the radio-frequency power source 150 and the plasma is further matched, using the values of the control amount of the VC1 and the control amount of the VC2 corresponding to a point on the maximum point $P_M$ side of the limit line $L_2$. Specifically, the control amount of the VC1 and the control amount of the VC2 are adjusted so that the power of the reflected wave output from the matcher 152 is decreased. The adjustment of the control amount of the VC1 and the adjustment of the control amount of the VC2 may be performed at the same time, may be performed alternately, or may be performed on one of them. Step S26 is an example of a stability control processing.

Subsequently, the control device 200 determines whether the plasma processing on the semiconductor wafer W is ended, based on the recipe stored in the memory (S27). When the plasma processing is not ended (No in step S27), the processing described in step S26 is executed again.

Meanwhile, when the plasma processing is ended (Yes in step S27), the control device 200 stops the supply of the radio-frequency power. Then, the processed semiconductor wafer W is carried out from the inside of the processing chamber 161, and the ignition support processing described in the flowchart is ended.

In the example in FIG. 11, step S25 that updates the starting point $P_S$ is executed between step S24 that specifies the limit line $L_2$ and step S26 that executes the stability control of the plasma, but the technology in the present disclosure is not limited thereto. For example, step S25 that updates the starting point $P_S$ may be executed later when the plasma processing is ended (Yes in step S27). Further, step S25 that updates the starting point $P_S$ may be executed before the ignition support processing on the subsequent semiconductor wafer W is started, or may be executed immediately before step S20 that sets the control amount of the VC1 and the control amount of the VC2 to the value corresponding to the starting point $P_S$.

[Hardware]

Figure 12:
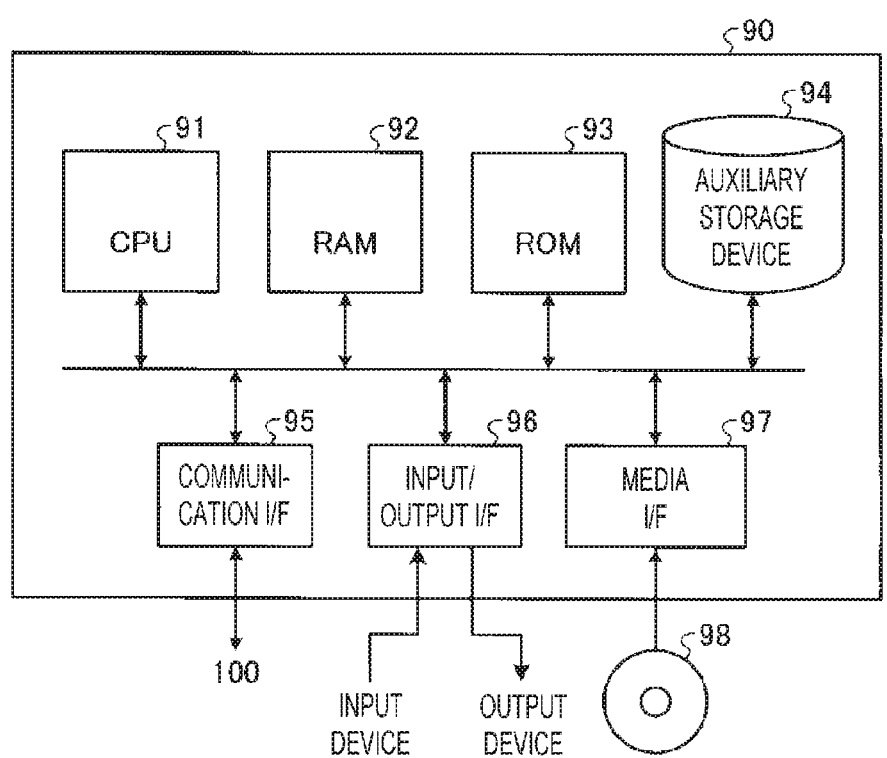
FIG. 12 is a view illustrating an example of a computer that implements function of a control device.

The control device 200 is implemented by a computer 90, for example, having a configuration illustrated in FIG. 12. FIG. 12 is a view illustrating an example of the computer 90 that implements the function of the control device 200. The computer 90 includes a central processing unit (CPU) 91, a random access memory (RAM) 92, a read only memory (ROM) 93, an auxiliary storage device 94, a communication interface (I/F) 95, an input/output interface (I/F) 96, and a media interface (I/F) 97.

The CPU 91 is operated based on a program stored in the ROM 93 or the auxiliary storage device 94 and controls each part. The ROM 93 stores, for example, a boot program executed by the CPU 91 when the computer 90 is activated, or a program dependent on the hardware of the computer 90.

The auxiliary storage device 94 is, for example, a hard disk drive (HDD) or a solid state drive (SSD), and stores, for example, a program executed by the CPU 91 and data used by the program. The CPU 91 reads the program from the auxiliary storage device 94, loads the program on the RAM 92, and executes the loaded program.

The communication I/F 95 communicates with the plasma processing apparatus 100 via a communication line such as a local area network (LAN). The communication I/F 95 receives data from the plasma processing apparatus 100 via the communication line and sends the data to the CPU 91, and sends the data generated by the CPU 91 to the plasma processing apparatus 100 via the communication line.

The CPU 91 controls an input device such as a keyboard, and an output device such as a display, via the input/output I/F 96. The CPU 91 acquires a signal input from the input device and sends the signal to the CPU 91 via the input/output I/F 96. Further, the CPU 91 outputs the generated data via the input/output I/F 96.

The media I/F 97 reads the program or data stored in a recording medium 98, and stores the program or data in the auxiliary storage device 94. The recording medium 98 may be, for example, an optical recording medium such as a digital versatile disc (DVD) or a phase change rewritable disk (PD), a magneto-optical recording medium such as a magneto-optical disk (MO), a tape medium, a magnetic recording medium, or a semiconductor memory. The auxiliary storage device 94 stores information such as the recipe of the process, the data collected in the data collecting processing, the maximum point $P_M$, the passing point $P_P$, the straight line $L_1$, the starting point $P_S$, the limit point $P_L$, and the limit line $L_2$.

The CPU 91 in the computer 90 reads the program loaded on the RAM 92 from the recording medium 98 and stores the program in the auxiliary storage device 94, but as another example, may acquire the program from other devices via the communication line and store the program in the auxiliary storage device 94.

In the above, one embodiment has been described. As described above, the plasma processing system 1 of the embodiment includes the plasma processing apparatus 100 and the control device 200. The plasma processing apparatus 100 includes the processing container 102 accommodating the semiconductor wafer W, and generates a plasma in the processing container 102 to perform the plasma processing on the semiconductor wafer W. The controller 200 controls the plasma processing apparatus 100. Further, the control device 200 executes the collecting processing, the first specifying processing, the second specifying processing, and the igniting processing. In the collecting processing, a measurement value indicating a matching state of the impedance between the radio-frequency power source 150 and the plasma, with respect to each value of the adjustable variables related to the matching of the impedance between the radio-frequency power source 150 that supplies a radio-frequency power to the plasma and the plasma is collected. In the first specifying processing, a point corresponding to the value of the variables that maximizes the gradient of the change of the measurement value with respect to the vector V extending from the point corresponding to each variable to the maximum point $P_M$ that is the point corresponding to the measurement value in a state where the impedance is most matched is specified as the passing point $P_P$. In the second specifying processing, on the straight line $L_1$ including the passing point $P_P$ and the maximum point $P_M$, a point farther from the maximum point $P_M$ than the passing point $P_P$ is specified as the starting point $P_S$ of the control. In the igniting processing, the plasma is ignited in the plasma processing apparatus 100 by controlling each variable so that the measurement value changes from the starting point $P_S$ to the maximum point $P_M$ along the straight line $L_1$. $P_P$) Therefore, the plasma may be stably ignited.

Further, in the embodiment described above, the gradient of the change of the measurement value in the first specifying processing is obtained by dividing the difference between the measurement value at the maximum point $P_M$ and the measurement value at the point corresponding to the variable by the magnitude of the vector V. Therefore, the gradient of the change of the measurement value in the direction toward the maximum point $P_M$ may be calculated.

Further, in the embodiment described above, the gradient of the change of the measurement value in the first specifying processing is a directional differential value in the direction indicated by the vector V when the measurement value is regarded as a function of the variable. Therefore, the gradient of the change of the measurement value in the direction toward the maximum point $P_M$ may be calculated.

Further, in the embodiment described above, the measurement value indicating the matching state of the impedance between the radio-frequency power source 150 and the plasma is the light emission intensity of the plasma. Therefore, the matching state of the impedance between the radio-frequency power source 150 and the plasma may be accurately estimated.

Further, in the embodiment described above, after the plasma is ignited, the control device 200 executes the stability control processing in which the value of each variable is adjusted so that the impedance between the radio-frequency power source 150 and the plasma is further matched. Therefore, the impedance between the radio-frequency power source 150 and the plasma may be matched more accurately.

Further, in the embodiment described above, the control device 200 further executes the measuring processing and the third specifying processing. In the measuring processing, the power of the reflected wave of the radio-frequency power from the upper electrode 104 is measured in the igniting processing. In the third specifying processing, the point corresponding to the value of the variables that maximizes the gradient of the decreasing of the power of the reflected wave is specified as the limit point $P_L$. In the stability control processing, the adjustment is performed using the values of the plurality of variables on the maximum point $P_M$ side of the straight line $L_2$ passing through the limit point $P_L$ and orthogonal to the straight line $L_1$. Therefore, the extinguishment of the plasma may be suppressed.

Further, in the embodiment described above, the control device 200 further executes the updating processing that, on the straight line $L_1$, updates the point $P_S'$ closer to the limit point $P_L$ than the starting point $P_S$ as a new starting point $P_S$. Therefore, when the plasma is ignited in the next time, the time required for the ignition of the plasma from the start of the control may be shortened.

Further, in the embodiment described above, the adjustable variable related to the matching of the impedance between the radio-frequency power source 150 and the plasma may be a plurality of variables. In this case, in the collecting processing, a measurement value indicating the matching state of the impedance between the radio-frequency power source 150 and the plasma, with respect to the combination of each value of the plurality of adjustable variables related to the matching of the impedance between the radio-frequency power source 150 and the plasma is collected. Further, in the first specifying processing, the point corresponding to the combination of the value of the variables that maximizes the gradient of the change of the measurement value with respect to the vector V extending from the point corresponding to each of the plurality of variables to the maximum point $P_M$ is specified as the passing point $P_P$. Therefore, it is possible to use variables that are more suitable for the actual system, and the plasma may be stably ignited.

Further, in the embodiment described above, the plurality of variables include at least one of the control amount of the VC1 and the control amount of the VC2 included in the matcher 152 that is connected between the upper electrode 104 that supplies the radio-frequency power into the plasma processing apparatus 100 and the radio-frequency power source 150. Therefore, the matching of the impedance between the radio-frequency power source 150 and the plasma may be easily adjusted.

[Others]

The disclosed technology is not limited to the above-described embodiments, and various modifications may be made within the scope of the disclosure.

For example, in the embodiment described above, the light emission intensity of the plasma is used as the measurement value indicating the matching state of the impedance between the radio-frequency power source 150 and the plasma. However, the disclosed technology is not limited thereto. For example, as the measurement value indicating the matching state of the impedance between the radio-frequency power source 150 and the plasma, for example, the magnitude of the power of the reflected wave with respect to the radio-frequency power supplied from the radio-frequency power source 150 to the plasma, the ratio of the radio-frequency power supplied from the radio-frequency power source 150 to the plasma and the power of the reflected wave, or the ratio of $V_{pp}$ and $V_{dc}$ of the radio-frequency power may be used. Alternatively, one value or a combination of two or more values selected from a group including the above measurement values and the light emission intensity of the plasma may be used as the measurement value indicating the matching state of the impedance between the radio-frequency power source 150 and the plasma. The $V_{pp}$ of the radio-frequency power is a difference between the maximum value and the minimum value of the voltage waveform, and the $V_{dc}$ of the radio-frequency power is a DC bias voltage superimposed on the radio-frequency power.

Further, in the embodiment described above, the control amount of the VC1 and the control amount of the VC2 in the matcher 152 are used as examples of the adjustable variables related to the matching of the impedance between the radio-frequency power source 150 and the plasma, but the disclosed technology is not limited thereto. For example, in the example in FIG. 2, the two variable capacitors (VC1 and VC2) are provided in the matcher 152. However, a variable inductance VL by a coil may be used instead of at least one of the variable capacitors. Further, in the example in FIG. 2, the VC2 is connected between a node between the radio-frequency power source 150 and the VC1 and the ground potential. However, the VC2 may be connected between a node between the VC1 and the upper electrode 104 and the ground potential, and an additional variable capacitor VC3 may be connected to the node between the VC1 and the upper electrode 104.

Further, in the embodiment described above, the radio-frequency power source 150 supplies the radio-frequency power having a predetermined single frequency to the upper electrode 104, but the disclosed technology is not limited thereto. For example, the radio-frequency power source 150 may supply the radio-frequency power having a frequency modulated by ±2% to ±20% with respect to the basic frequency (e.g., 60 MHz) to the upper electrode 104. In this case, the control device 200 modulates the frequency of the radio-frequency power output from the radio-frequency power source 150 so that the output impedance of the radio-frequency power source 150 and the impedance of the plasma in the processing chamber 161 are matched. As the adjustable variables related to the matching of the impedance, for example, the control amount related to the frequency of the radio-frequency power indicating the frequency that may be modulated with respect to the basic frequency by a ratio [%] may be used.

Further, as other adjustable variables related to the matching of the impedance between the radio-frequency power source 150 and the plasma, for example, the type of the processing gas, the pressure of the processing gas, the flow rate of the processing gas, the pressure in the processing chamber 161, and the temperature of the semiconductor wafer W may be used. Further, the variable used when the plasma is ignited and the variable used for the stability control of the plasma after the plasma is ignited may be the same, or may be different from each other.

Further, in the embodiment described above, the matching of the impedance between the radio-frequency power source 150 and the plasma is performed by adjusting the plurality of variables. However, the disclosed technology is not limited thereto, and the matching may be performed by adjusting one type of variable. For example, a series of controls may be performed by the control amount of the VC1, while the control amount of the VC2 or other variables are fixed, Further, in the embodiment described above, the maximum point $P_M$ specified based on the data collected by the data collecting processing is used as the point corresponding to the state where the impedance between the radio-frequency power source 150 and the plasma is most matched, but the disclosed technology is not limited thereto. For example, in the stability control after the plasma is ignited, the maximum point $P_M$ may be updated by a point $P_M'$ at which the impedance between the radio-frequency power source 150 and the plasma is actually most matched. When the maximum point $P_M$ is updated, the vector $V_P$, the straight line $L_1$, and the starting point $P_S$ are updated using the updated maximum point $P_M$. Therefore, the ignition of the plasma may be controlled based on the measurement value according to the environment in which the process is actually performed.

Alternatively, when the maximum point $P_M$ is updated, the passing point $P_P$ serving as the starting point of the vector $V_P$ may be updated by translating the vector $V_P$ so that the end point coincides with the updated maximum point $P_M$. In this case, the straight line $L_1$ and the starting point $P_S$ are updated using the updated maximum point $P_M$ and the updated passing point $P_P$.

Further, in the embodiment described above, the plasma processing system 1 that performs the processing using a capacitively coupled plasma (CCP) as an example of the plasma source, but the plasma source is not limited thereto. Plasma sources other than a capacitively coupled plasma may include, for example, an inductively coupled plasma (ICP), a microwave excited surface wave plasma (SWP), an electron cyclotron resonance plasma (ECP), and a helicon wave excited plasma (HWP). That is, the present disclosure is not limited to the plasma source using a radio-frequency power source and an electrode such as a capacitively coupled plasma (CCP), and plasma sources such as an inductively coupled plasma (ICP) using a radio-frequency power source and an antenna or a microwave excited surface wave plasma (SWP) using a microwave power source and a waveguide having adjustable variables with respect to matching of impedance between a plasma generating power source and a plasma may be controlled in the same manner.

According to various aspects and embodiments of the present disclosure, a plasma may be stably ignited.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing system comprising:
a plasma processing apparatus configured to perform a plasma processing on a substrate and including:
a processing container configured to accommodate the substrate;
a power supply configured to supply a radio-frequency power into the processing container through a conductor; and
a matching box including a variable capacitor connected between the conductor and the power supply and another variable capacitor connected between the power supply and a ground potential, and
a controller configured to control the plasma processing apparatus, wherein the controller is further configured to:
collect a measurement value indicating a matching state of impedance between the power supply that supplies the radio-frequency power to the plasma and the plasma, with respect to each value of a variable that is adjustable related to matching of the impedance;
specify as a passing point, a point corresponding to a value of the variable that maximizes a gradient of change of the measurement value with respect to a vector extending from a point corresponding to the variable to a matching point corresponding to a measurement value in a state where the impedance is matched;
specify as a control start point, a point farther from the matching point than the passing point on a straight line including the passing point and the matching point;
ignite the plasma in the plasma processing apparatus by controlling the variable such that the measurement value changes from the control start point toward the matching point and from a direction in which the gradient of change of the measurement value is relatively steep toward a direction in which the gradient of change of the measurement value is relatively gentle, along the straight line.

2. The plasma processing system according to claim 1, wherein, when the passing point is specified, the gradient of the change of the measurement value is obtained by dividing a difference between the measurement value at the matching point and the measurement value at the point corresponding to the variable by a magnitude of the vector.

3. The plasma processing system according to claim 1, wherein, when the passing point is specified, the gradient of the change of the measurement value is a directional differential value in a direction indicated by the vector when the measurement value is regarded as a function of the variable.

4. The plasma processing system according to claim 3, wherein the measurement value indicating the matching state of the impedance between the power supply and the plasma is one value or a combination of two or more values selected from the group consisting of a light emission intensity of the plasma, a magnitude of power of a reflected wave with respect to the radio-frequency power supplied from the power supply to the plasma, a ratio of the radio-frequency power supplied from the power supply to the plasma and the power of the reflected wave, and a ratio of Vpp and Vac of the radio-frequency power.

5. The plasma processing system according to claim 4, wherein the controller is further configured to adjust a value of the variable such that the impedance between the power supply and the plasma is further matched, after the plasma is ignited.

6. The plasma processing system according to claim 5, wherein the controller is further configured to:
measure the power of the reflected wave of the radio-frequency power from the conductor, when the plasma is ignited; and
specify, as a limit point, a point corresponding to the value of the variable that maximizes a gradient of decreasing of the power of the reflected wave, and
wherein, the controller adjusts the variable using a value of the variable closer to a side of the matching point than a straight line that passes through the limit point and is orthogonal to the straight line.

7. The plasma processing system according to claim 6, wherein the controller is further configured to update a point, on the straight line, closer to the limit point than the control start point as a new control start point.

8. The plasma processing system according to claim 7, wherein the variable includes a plurality of variables that are adjustable,
when the measurement value is collected, measurement values indicating a matching state of the impedance between the power supply and the plasma, with respect to a combination of values of the plurality of variables related to the matching of the impedance are collected, and
when the passing point is specified, a point corresponding to the combination of the values of the variables that maximizes the gradient of the change of the measurement value with respect to the vector extending from a point corresponding to each of the plurality of variables to the matching point is specified as the passing point.

9. The plasma processing system according to claim 8, wherein each of the plurality of variables includes at least one of a control amount of the variable capacitor, and a control amount related to a frequency of the radio-frequency power.

10. The plasma processing system according to claim 1, wherein the measurement value indicating the matching state of the impedance between the power supply and the plasma is one value or a combination of two or more values selected from the group consisting of a light emission intensity of the plasma, a magnitude of power of a reflected wave with respect to the radio-frequency power supplied from the power supply to the plasma, a ratio of the radio-frequency power supplied from the power supply to the plasma and the power of the reflected wave, and a ratio of V PP and V de of the radio-frequency power.

11. The plasma processing system according to claim 1, wherein the controller is further configured to adjust a value of the variable such that the impedance between the power supply and the plasma is further matched, after the plasma is ignited.

12. The plasma processing system according to claim 1, wherein the variable includes a plurality of variables that are adjustable, when the measurement value is collected, measurement values indicating a matching state of the impedance between the power supply and the plasma, with respect to a combination of values of the plurality of variables related to the matching of the impedance are collected, and when the passing point is specified, a point corresponding to the combination of the values of the variables that maximizes the gradient of the change of the measurement value with respect to the vector extending from a point corresponding to each of the plurality of variables to the matching point is specified as the passing point.

13. The plasma processing system according to claim 1, wherein the variable includes at least one of a control amount of the variable capacitor, and a control amount related to a frequency of the radio-frequency power.

\* \* \* \* \*